(12) United States Patent
Schindler et al.

(10) Patent No.: US 8,866,337 B2
(45) Date of Patent: Oct. 21, 2014

(54) INLINE POWER MULTIPLEXER DEVICE

(75) Inventors: Frederick Roland Schindler, Sunnyvale, CA (US); Koussalya Balasubramanian, Sunnyvale, CA (US); Kamran Torabi, Los Altos Hills, CA (US)

(73) Assignee: Cisco Technology, Inc., San Jose, CA (US)

( * ) Notice: Subject to any disclaimer, the term of this patent is extended or adjusted under 35 U.S.C. 154(b) by 702 days.

(21) Appl. No.: 13/197,807

(22) Filed: Aug. 4, 2011

(65) Prior Publication Data

US 2013/0033106 A1    Feb. 7, 2013

(51) Int. Cl.
*H02J 3/14* (2006.01)
*H03K 19/173* (2006.01)
*H02J 7/00* (2006.01)

(52) U.S. Cl.
CPC .......... *H02J 7/0065* (2013.01); *H03K 19/1733* (2013.01)
USPC .................. 307/38; 307/31; 307/80; 379/413

(58) Field of Classification Search
CPC ........................... H03K 19/1733; H02J 7/0065
USPC ........................................................... 307/38
See application file for complete search history.

(56) References Cited

U.S. PATENT DOCUMENTS

| 7,436,950 | B2* | 10/2008 | Chheda et al. ............... 379/413 |
| 7,921,307 | B2 | 4/2011 | Karam et al. |
| 7,921,314 | B2 | 4/2011 | Schindler et al. |
| 7,930,568 | B2 | 4/2011 | Schindler |
| 8,004,111 | B2* | 8/2011 | Potter et al. .................... 307/20 |

* cited by examiner

*Primary Examiner* — Rexford Barnie
*Assistant Examiner* — Toan Vu
(74) *Attorney, Agent, or Firm* — Edell, Shapiro & Finnan, LLC

(57) ABSTRACT

Techniques are provided for providing power onto multiple power distribution paths. Power controller devices receive power from a power source device and are coupled to first and second multiplexer units. The multiplexer units receive power from the power source devices via the power controller devices for first and second power distribution paths. A multiplexer control unit controls the multiplexer units to output power from the first power distribution path, the second power distribution path or both of the paths. Power subsystems are provided comprising first and second power transistor units. The first transistor unit receives power from the first multiplexer unit over the first path and the second transistor unit receives power from the second multiplexer unit over the second path. Ports are provided and are coupled to a powered device. The multiplexer control unit controls the multiplexer units to supply power to the respective ports according to the type of powered device detected at a port.

20 Claims, 8 Drawing Sheets

INLINE POWER MULTIPLEXER DEVICE

TECHNICAL FIELD

The present disclosure relates to power distribution to network ports across multiple power distribution paths.

BACKGROUND

Powered devices (PDs) operating under the Institute of Electrical and Electronic Engineers (IEEE) inline power standards, e.g., the IEEE 802.3 standard, are attractive to customers for their electrical power saving capabilities. Often PDs will require more power than what is provided by power source devices. In such cases, PDs receive power from multiple IEEE 802.3 compliant power source equipment (PSE) devices. Equipment producers, however, are reluctant to build these high-power PDs until more high-power PSEs are available. Similarly, PSE producers are reluctant to build high-power PSEs until there are more high-power PDs. This prevents broad market acceptance of higher powered PDs.

DESCRIPTION OF EXAMPLE EMBODIMENTS

Overview

Techniques are provided for multiplexing power onto multiple power distribution paths. A plurality of power controller devices receive power from a power source device. A first multiplexer unit and a second multiplexer unit are coupled to the plurality of power controller devices. The first multiplexer unit is configured to receive power from the power source device via each of the plurality of power controller devices for a first power distribution path and the second multiplexer unit is configured to receive power from the power source devices via each of the plurality of power controller devices for a second power distribution path. A multiplexer control unit is coupled to the first multiplexer unit and the second multiplexer unit and is configured to control the first multiplexer unit and the second multiplexer unit so as to output power either the first power distribution path, the second power distribution path or from both the first and second power distribution paths. A plurality of power subsystems are provided comprising a first power transistor unit configured to receive power from the first multiplexer unit over the first power distribution path and a second power transistor unit configured to receive power from the second multiplexer unit over the second power distribution path. A plurality of ports are also provided, each of which is configured to couple to a powered device and to supply power to the powered device from a corresponding subsystem. The multiplexer control unit is configured to control the first and second multiplexer units to output power to at least one of the plurality of ports according to the type of powered device connected to the at least one of the plurality of ports.

EXAMPLE EMBODIMENTS

Figure 1:
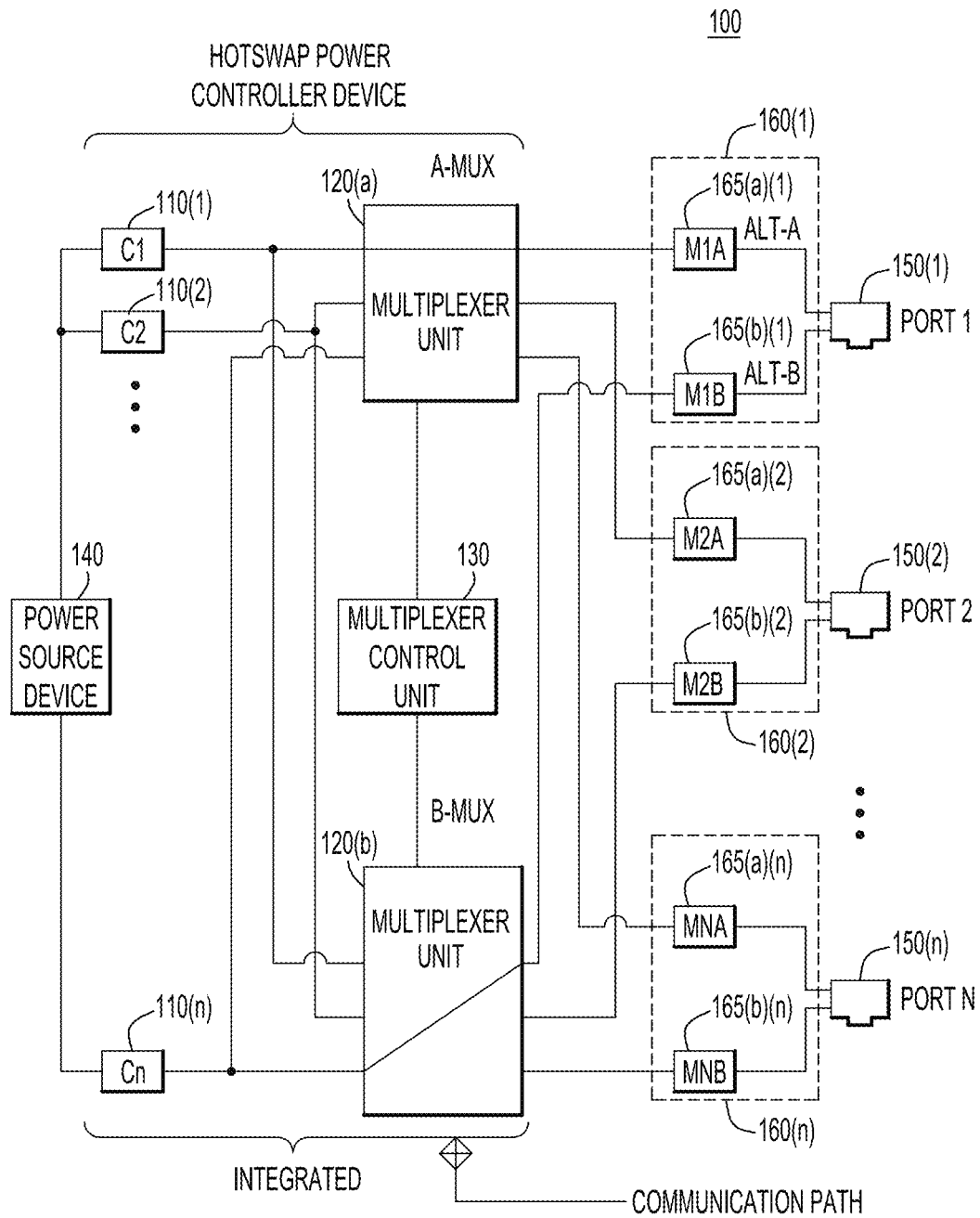
FIG. 1 is a block diagram of an example system including a plurality of power controller devices, a plurality of multiplexer units and a management control unit to enable power delivery from a power source device to a plurality of network ports.

FIG. 1 shows an example system 100 including a plurality of power controller devices 110(1)-110(n), a plurality of multiplexer units 120(a) and 120(b) coupled to the power controller devices 110(a)-110(n), and a multiplexer control unit 130 coupled to the multiplexer units 120(a) and 120(b). A power source device 140 is coupled to the power controller devices 110(1)-110(n) and is configured to supply power to the power controller devices 110(1)-110(n). Additionally, system 100 has a plurality of ports 150(1)-150(n), each of which are coupled to a corresponding power subsystem (shown at reference numerals 160(1)-160(n)). For example, a first port 150(1) is coupled to a first power subsystem 160(1), a second port 150(2) is coupled to a second power subsystem 160(2) and so on.

Each of the power subsystems 160(1)-160(n) includes a plurality of power transistor units. For example, power subsystem 160(1) comprises a first power transistor unit 165(a)(1) and a second power transistor unit 165(b)(1), power subsystem 160(2) comprises a first power transistor unit 165(a)(2) and a second power transistor unit 165(b)(2), and so on. In general, each of the first power transistor units of the power subsystems are configured to receive power from of the first multiplexer unit, and each of the second power transistor units of the power subsystems are configured to receive power from of the second multiplexer unit. The first and second power transistor units are, for example, power Metal Oxide Field Effect Transistors (MOSFETs) or other types of suitable power transistors configured to receive power.

As shown in FIG. 1, each of the power controller devices 110(1)-110(n) is configured to deliver power to both of the multiplexer units 120(a) and 120(b) across multiple power distribution paths. For example, power controller device 110(1) receives power from the power source device 140 and delivers power to multiplexer unit 120(a) (hereinafter referred to as the "first multiplexer unit") along a first power distribution path and to multiplexer unit 120(b) (hereinafter referred to as the "second multiplexer unit") along a second power distribution path. The same is true for the remaining power controller devices 110(2)-110(n). Thus, if there are n power controller devices and n ports in system 100, the power controller devices 110(1)-110(n) provide 2n power paths (e.g., n power paths to the first multiplexer unit 120(a) and n power paths to the second multiplexer unit 120(b)). In one example, the power controller devices 110(1)-110(n) are hot swap controllers for power over Ethernet (PoE) systems in accordance with the Institute for Electrical and Electronic Engineers (IEEE) standard 802.3. In one implementation, the power controller devices 110(1)-110(n), the multiplexer units 120(a) and 120(b) and the multiplexer controller unit 130 are combined into one integrated device power controller device called a hot swap power controller device.

Upon receiving power from the power controller devices 110(1)-110(n), the multiplexer units 120(a) and 120(b) are configured to deliver power to the appropriate power transistor units of the power subsystems. In other words, the connections from the power controller devices 110(1)-110(n) are multiplexed (e.g., analog-multiplexed) to the ports 150(1)-150(n) such that power can be delivered to powered devices coupled to the ports, as described herein. In one example, the first power transistor unit of each power subsystem (each of which is referenced with a "165(a)" designation in FIG. 1) receives power from the first multiplexer unit 120(a) along a first power distribution path, and the second power transistor unit of each power subsystem (each of which is reference with a "165(b)" designation in FIG. 1) receives power from the second multiplexer unit 120(b) along a second power distribution path. The multiplexer units 120(a) and 120(b) may be multiplexer units suitable to interface with the power controller devices 110(1)-110(n) in a PoE system. In another example, the first power transistor unit of each power subsystem (each of which is referenced with reference numeral 165(a) designation in FIG. 1) receives power from the first multiplexer unit 120(a) along a first power distribution path, and the second power transistor unit of each power subsystem (each of which is reference with reference numeral 165(b) designation in FIG. 1) may be disabled.

The ports 150(1)-150(n) are configured to interface with one or more powered devices (not shown) such that power can be delivered from the power source device 140 to the powered device via one or more of the power controller devices 110 (1)-110(n), multiplexer units 120(a) and 120(b) and power subsystems 160(1)-160(n) along first and second power distribution paths. The powered devices may receive power at different power levels across different distribution paths based on its type, as described herein.

In one example, after a powered device is plugged into one of the ports 150(1)-150(n), the multiplexer control unit 130 will detect and determine the type of powered device that is plugged in and will control the multiplexer units 120(a) and 120(b) to deliver appropriate power to the power subsystem associated with the port of the powered device. As indicated above, in one embodiment, powered device type detection may not be done by the multiplexer control unit 130. A processor outside of the multiplexer control unit 130 may perform the powered device detection and type (e.g., two-pair Alternative-A, two-pair Alternative-B, or four-pair) determination. For example, four-pair detection may be performed using a link layer description protocol, generally through software executed on a processor with access to frames exchanged on the network. If the powered device is of a type that requires enhanced inline power (e.g., four-pair PoE), the multiplexer control unit 130 controls the first multiplexer unit 120(a) and the second multiplexer unit 120(b) to output power from both the first and second distribution paths to the particular port to which the powered device is connected. If the powered device is of a type that does not require enhanced inline power (e.g., PD requires two-pair PoE), the multiplexer control unit 130 controls either the first multiplexer unit 120 (a) to output power from the first distribution path or the second multiplexer unit 120(b) to output power from the second distribution path.

Figure 2:
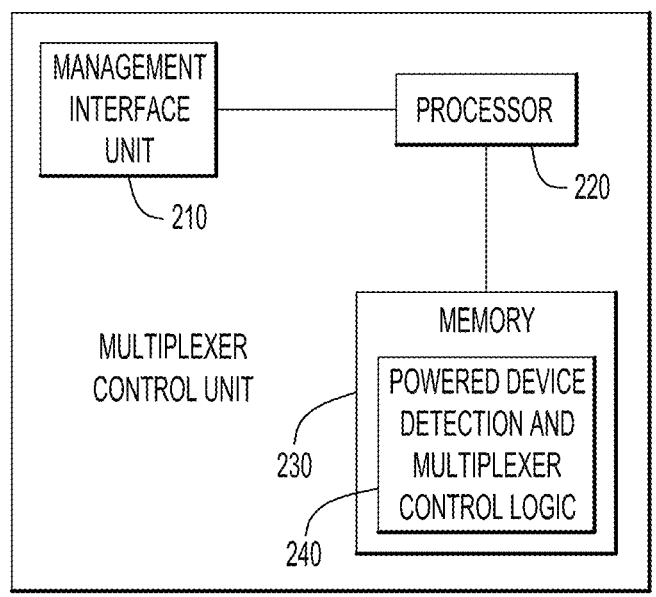
FIG. 2 shows an example block diagram of the management control unit configured with powered device detection and multiplexer control logic configured to control the multiplexer units to output power to the ports along appropriate power distribution paths.

Reference is now made to FIG. 2, which shows an example block diagram of the multiplexer control unit 130. The multiplexer control unit 130 comprises a management interface unit 210, a processor 220 and a memory 230. The management interface unit 210 is configured to transmit and receive network communications (e.g., network commands) with the first multiplexer unit 120(a) and the second multiplexer unit 120(b) to control the multiplexer units to deliver appropriate power to one or more of the plurality of ports 150(1)-150(n). It should be appreciated that the operations performed by the management interface unit 210 may be implemented by an external processor performing services for an internetwork operating system (IOS), of which system 100 belongs. The management interface unit 210 may be configured to communicate over a standard management bus, such as an Inter-Integrated Circuit ($I^2C$) management bus.

The processor 220 is coupled to the management interface unit 210 and to the memory 230. Processor 220 is a microprocessor or microcontroller that is configured to execute program logic instructions (i.e., software) for carrying out various operations and tasks described herein. For example, processor 220 is configured to execute powered device detection and multiplexer control logic 240 that is stored in memory 230. The powered device detection and multiplexer control logic 240, when executed by the processor 220, causes the processor 220 to detect whether a powered device is plugged into one or more of the ports 150(1)-150(n), to classify the powered device as a particular type, and to transmit controls to the multiplexer units 120(a) and 120(b) to deliver appropriate power to the ports based on the type of powered device detected. Memory 230 may comprise read only memory (ROM), random access memory (RAM), magnetic disk storage media devices, optical storage media devices, flash memory devices, electrical, optical or other physical/tangible memory storage devices.

The functions of processor 220 may be implemented by logic encoded in one or more tangible computer readable storage media (e.g., embedded logic such as an application specific integrated circuit, digital signal processor instructions, software that is executed by a processor, etc), wherein memory 230 stores data used for the operations described herein and stores software or processor executable instructions that are executed to carry out the operations described herein.

The powered device detection and multiplexer control logic 240 may take any of a variety of forms, so as to be encoded in one or more tangible computer readable memory media or storage device for execution, such as fixed logic or programmable logic (e.g., software/computer instructions executed by a processor) and the processor 220 may be an application specific integrated circuit (ASIC) that comprises fixed digital logic, or a combination thereof. For example, the processor 220 may be embodied by digital logic gates in a fixed or programmable digital logic integrated circuit, which digital logic gates are configured to perform the powered device detection and multiplexer control logic 240. In general, the powered device detection and multiplexer control logic 240 may be embodied in one or more computer readable storage media encoded with software comprising computer executable instructions and when the software is executed operable to perform the operations described herein for the process logic 240.

In general, as stated above, the multiplexer control unit 130 controls the first multiplexer unit 120(a) and the second multiplexer unit 120(b) to deliver appropriate power to one or more of the ports 150(1)-150(n). In one example, the multiplexer units 120(a) and 120(b) may receive power from the power controller devices 110(1)-110(n) and in turn provide power to the ports in accordance with a plurality of types (levels) of power, examples of which are those according to the IEEE 802.3 Alternative-A and Alternative-B power standards. In other words, each of the power controllers 110(1)-

110(*n*) may deliver power to the first multiplexer unit 120(*a*) along the first power distribution path (e.g., for IEEE 802.3 Alternative-A power). In turn, the first multiplexer unit 120(*a*) may deliver Alternative-A power (received from one or more of the power controller devices 110(1)-110(*n*)) along the first power distribution path to each first power transistor unit of the power subsystems 160(1)-160(*n*). Similarly, each of the power controllers 110(1)-110(*n*) may deliver power to the second multiplexer unit 120(*b*) along the second power distribution path (e.g., for IEEE 802.3 Alternative-B power), and the second multiplexer unit 120(*b*) and may deliver Alternative-B power along the second power distribution path to each second power transistor unit of the power subsystems 160(1)-160(*n*). It should be appreciated that the power received by the multiplexer units 120(*a*) and 120(*b*) from power controller devices 110(1)-110(*n*) may be configured to be delivered to any of the ports 150(1)-150(*n*) and power subsystems 160(1)-160(*n*). For example, power controller device 110(1) may ultimately deliver power (via multiplexer units 120(*a*) and 120(*b*)) to port 150(1), port 150(2), and so on. The same is true for the other power controller devices 110(2)-110(*n*).

In one embodiment, each of the ports 150(1)-150(*n*) is coupled to a dedicated power distribution path (e.g., the first power distribution path) and to a multiplexed power distribution path (e.g., the second power distribution path). In this way, power is delivered to each of the ports 150(1)-150(*n*) along the dedicated power distribution path, and additional power may be delivered to each of the ports 150(1)-150(*n*) along the multiplexed power distribution paths based on a type of powered device that is coupled to the ports. The power controller devices 110(1)-110(*n*) can deliver power to multiple ports. For example, power controller device 110(1) may deliver Alternative-A power along the first, dedicated path to port 150(1) or may deliver Alternative-B power along the second, multiplexed path to port 150(*n*). Likewise, power controller device 110(*n*) may deliver Alternative-A power along the first, dedicated path to port 150(*n*) or may deliver Alternative-B power along the second, multiplexed path to port 150(1). It should be appreciated that other combinations and permutations of power distribution along distribution paths between the power controller devices and the ports are possible. Alternatively, in another embodiment, both the first power distribution path and the second power distribution path can be multiplexed. In this embodiment, for example, the power controller device 110(1)-110(*n*) may deliver Alternative-A and Alternative-B power to any of the port devices along first and second power distribution paths.

As stated above, enhanced power may be delivered to a powered device depending on its type. When a powered device is capable of receiving so-called four-pair power, power may be distributed to the port to which the powered device is coupled over dedicated and multiplexed distribution paths. For example, assuming system 100 has a 2×6 connector (e.g., 2 rows of 6 connections for a total of 12 connections), each capable of receiving power along a first distribution path and a second distribution path (i.e., 2×6 ports), the following combinations may result:

TABLE 1

| Number of available connections available for PoE | |
|---|---|
| Number of enhanced (four-pair capable) powered devices | Number of (two-pair) PoE connections available |
| 0 | 12 |
| 1 | 10 |
| 2 | 8 |

TABLE 1-continued

| Number of available connections available for PoE | |
|---|---|
| Number of enhanced (four-pair capable) powered devices | Number of (two-pair) PoE connections available |
| 3 | 6 |
| 4 | 4 |
| 5 | 2 |
| 6 | 0 |

That is, as seen by the Table 1, each four-pair capable powered device requires both of the power distribution paths when it is plugged into a port. Thus, in the absence of a four-pair capable powered device plugged into any of the ports, each port has two possible paths for power delivery (first and second power distribution paths). Since the four-pair capable powered devices require both the first and second power distribution paths, when one of these devices is plugged into a port, the number of possible paths for power delivery of the system is reduced by two. The possible paths to the remaining ports can be multiplexed so that appropriate power is delivered to them.

Figure 3:
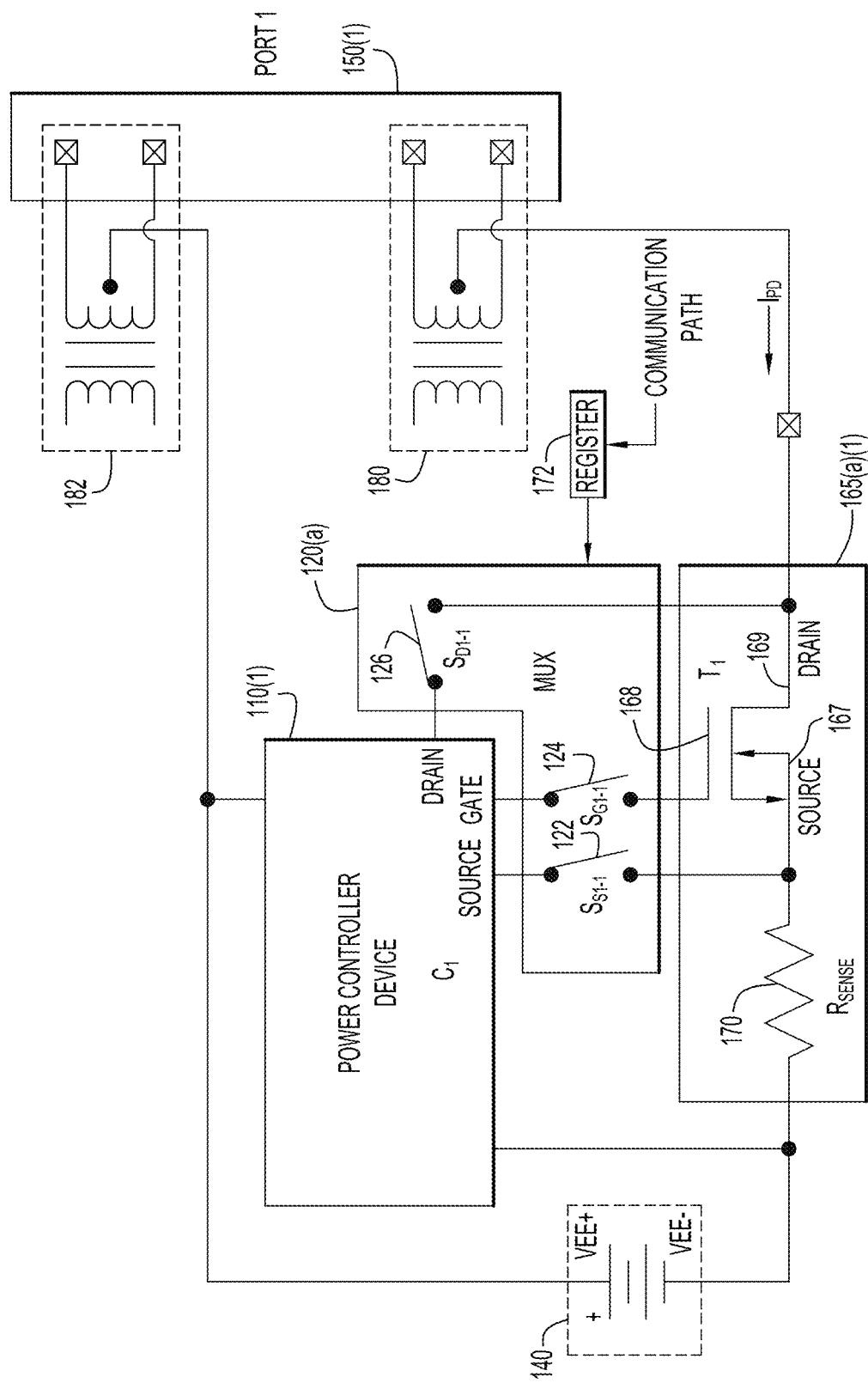
FIG. 3 shows an example schematic circuit diagram of electrical components of the system for delivering power to a port along a power distribution path.

Reference is now made to FIG. 3, which shows an example schematic circuit diagram of electrical components for delivering power to a port along a power distribution path. In FIG. 3, the power source device 140 (represented by a voltage source VEE$^+$, though it should be appreciated that a current source may also be used) delivers power to the power controller device 110(1). A typical power controller device (e.g., PoE power controller) provides three paths to a power subsystem. The power controller device interfaces with the first multiplexer device 120(*a*), which comprises a plurality of switches, shown at reference numerals 122, 124 and 126. The switches 122, 124 and 126 are configured to enable power delivery between the power controller device 110(1) and the power transistor unit 165(*a*)(1). For example, as shown in FIG. 3, switch 122 may be configured to interface with the source 167 of the power transistor unit 165(*a*)(1), switch 124 may be configured to interface with the gate 168 of the power transistor unit 165(*a*)(1), and switch 126 may be configured to interface with the drain 169 of the power transistor unit 165(*a*)(1).

Each switch is identified by a symbol in the format "$S_{X,N1-N2}$," wherein the "X" subscript of the symbol may be an "S" to denote a source switch, a "G" to denote a gate switch or a "D" to denote a drain switch. The "N1" subscript of the symbol is a number that denotes the particular power controller device. For example, if "N1" is the number "1," then the symbol is identified as being associated with power controller device 110(1) (e.g., power controller device C1). If "N1" is the number "2," then the symbol is identified as being associated with power controller device 110(2), and so on. The "N2" subscript of the symbol is a number that denotes the power subsystem that the switch is coupled to. For example, if "N2" is the number "1," then the symbol is identified as being associated with the first power subsystem 160(1). If "N2" is the number "2," then the symbol is identified as being associated with the second power subsystem 160(2), and so on. Thus, as shown in FIG. 3, switch 122 is identified by symbol "$S_{S1-1}$" to indicate that it is a switch coupled to a source of a power transistor unit and that it is associated with the first power controller device 110(1) and the first power subsystem 160(1). Switch 124 is identified by symbol "$S_{G1-1}$" to indicate that it is coupled to a gate and associated with the first power controller device 110(1) and the first power subsystem 160(1). Switch 126 is identified by symbol "$S_{D1-1}$" to indicate that it is coupled to a drain and associated with the first power controller device 110(1) and the first power subsystem 160(1).

The power transistor unit 165(a)(1) comprises a transistor (e.g., a MOSFET) and a sense resistor, depicted at reference numerals 167 and 170 respectively. It should be appreciated that the power controller device 110(1), the first multiplexer unit 120(a), port 150(a) and the power transistor unit 165(a)(1) are depicted for simplicity and that any of the power controllers 110(1)-110(n), multiplexer units 120(a), ports 150(1)-150(n) and power transistor units 165(a)(1)-165(a)(n) may be used in the operation configuration shown in FIG. 3.

In FIG. 3, a register, shown at 172, is written with control information that causes the first multiplexer unit 120(a) to open or close switches 122, 124 and 126. For example, register 172 may be coupled to (or may be a part of) the multiplexer control unit 130 to receive controls or instructions to be transmitted to the first multiplexer unit 120(a). The register 172 may receive the controls or instructions, for example, via an I²C bus, Universal Asynchronous Receiver/Transmitter (UART), Serial Peripheral Interface (SPI) bus, etc. Based on the instructions, the first multiplexer unit 120(a) will either keep switches 122, 124 and 126 in an open position, and thus preventing power from being delivered to the transistor unit 165(a)(1) or will close switches 122, 124 and 126 to allow power to be delivered from to the transistor unit 165(a)(1). When the multiplexer unit 120(a) closes switches 122, 124 and 126, power is also delivered from the power controller device 110(1) to a first transformer 180 of the port 150(1). Power is also delivered to a second transformer 182 of the port 150(1) regardless of whether the switches 122, 124 and 126 are open or closed. Power to the second transformer 182 is delivered only when switches are closed in multiplexer unit 120(a). However, an alternate path to VEE—may exist and that path to the second transformer 182 is not prevented from providing power.

Figure 4:
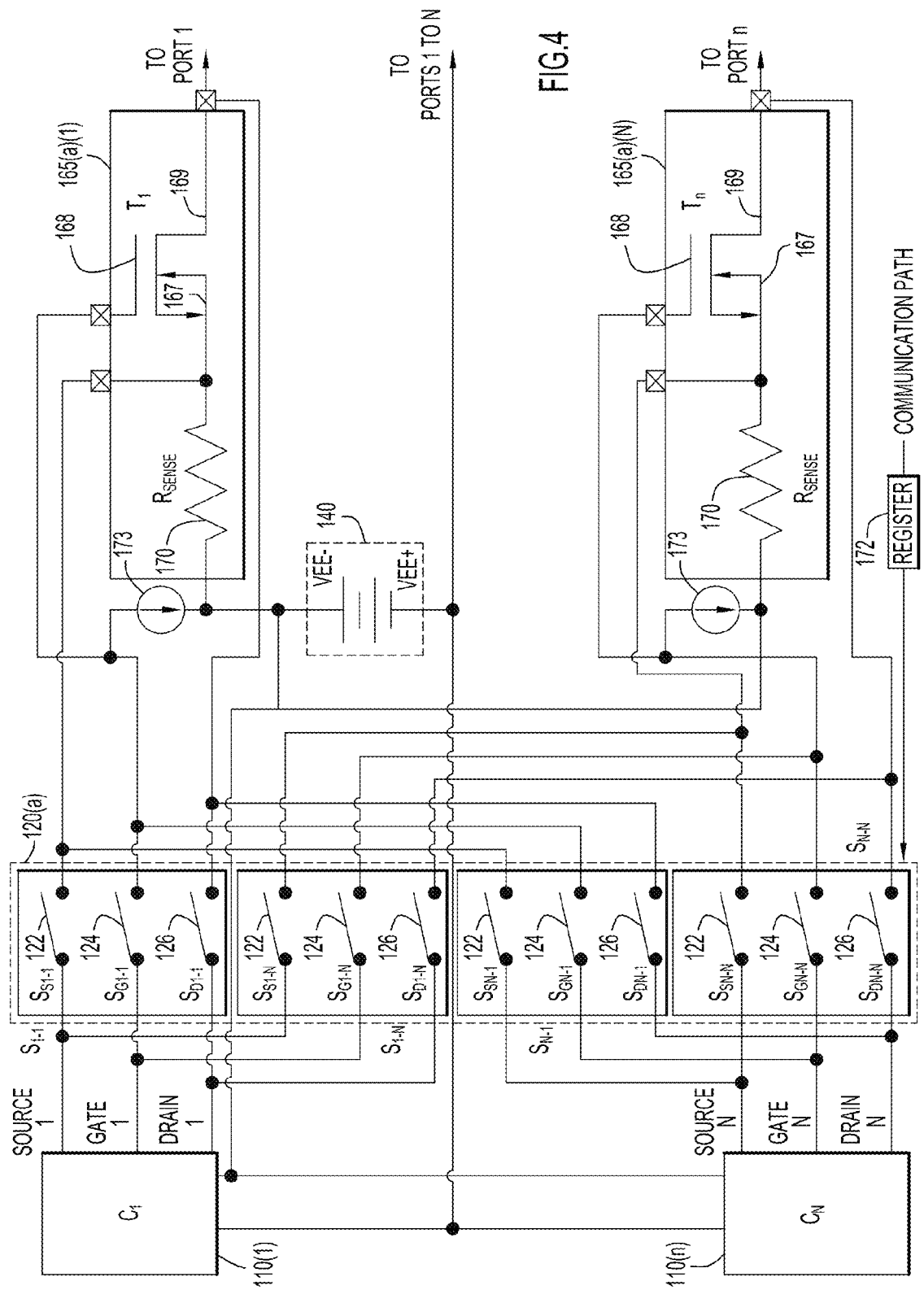
FIG. 4 shows an example schematic circuit diagram of electrical components of the system for delivering power to multiple ports.

FIG. 4 shows an example schematic diagram of electrical components for delivering power to multiple ports. In FIG. 4, multiple power controller devices, depicted at 110(1)-110(n), receive power from the power source device 140 and are coupled to a corresponding set of switches within the first multiplexer unit 120(a). The switches are coupled to corresponding power transistor units (e.g., 165(a)(1)-165(a)(n)), which are coupled to corresponding ports (e.g., port 1 150(1) to port N 150(N), not shown). Each of the switches in FIG. 4 are identified by an appropriate switch symbol, as described above in connection with FIG. 3. For example, as shown in FIG. 4, power controller device 110(1) is connected to a corresponding first switch set comprising switches $S_{S1\text{-}1}$, $S_{G1\text{-}1}$ and $S_{D1\text{-}1}$ and is connected to a corresponding second switch set comprising switches $S_{S1\text{-}N}$, $S_{G1\text{-}N}$ and $S_{D1\text{-}N}$. The first switch set associated with the power controller device 110(1) includes switches 122, 124 and 126 that are associated with the source 167, gate 168 and drain 169 of the first power transistor unit 165(a)(1) for port 150(1) (not shown). Similarly, the second switch set associated with the power controller device 110(1) includes switches 122, 124 and 126 that are associated with the source 167, gate 168 and drain 169 of the first power transistor unit 165(a)(n) for port 150(n) (not shown).

Additionally, as shown, controller device 110(n) is connected to a corresponding first switch set comprising switches $S_{SN\text{-}1}$, $S_{GN\text{-}1}$ and $S_{DN\text{-}1}$ and is connected to a corresponding second switch set comprising switches $S_{SN\text{-}N}$, $S_{GN\text{-}N}$ and $S_{DN\text{-}N}$. The first switch set associated with the power controller device 110(n) includes switches 122, 124 and 126 that are associated with the source 167, gate 168 and drain 169 of the first power transistor unit 165(a)(1) for port 150(1), and the second switch set associated with the power controller device 110(n) includes switches 122, 124 and 126 that are associated with the source 167, gate 168 and drain 169 of the first power transistor unit 165(a)(1) for port 150(n). Although switches for power controller devices 110(1) and 110(n) are shown in FIG. 4, it should be appreciated that all of the power controller devices 110(1)-110(n) may have corresponding switch sets coupled to each of the power transistor units of the power subsystems 160(1)-160(n) and to the ports 150(1)-150(n).

Associated with each power transistor unit 165(a)(1) to 165(a)(N) is a current source 173. Current source 173 is a weak current source or high-valued resister (e.g., approximately 50 k ohms). When switches connected to gate 168 of power transistor units 165(a)(1)-165(a)(N) are open, the current source 173 causes the gate-source voltage to remain below turn-on voltage of the gate of the power transistor unit 165(a)(1). When the switches connected to gate 168 of power transistor units 165(a)(1)-165(a)(N) are closed and the power transistor units 165(a)(1)-165(a)(N) are used to provide power to their attached ports, the current source 173 does not significantly affect circuit operation.

Figure 5A:
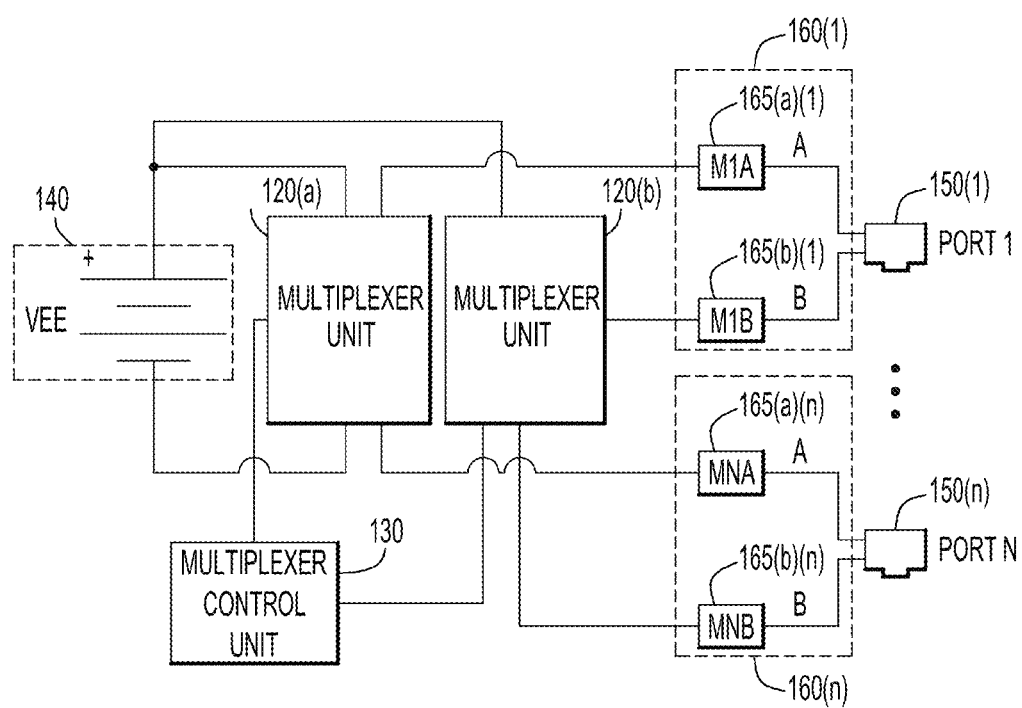
FIG. 5A shows an example system topology for delivering power to ports via multiple power distribution paths.

Turning to FIG. 5A, an example system topology is shown for delivering power to ports via multiple power distribution paths. For example, as described above, the power source device 140 is configured to deliver power (via power controller devices, not shown in FIG. 5A) to the multiplexer units 120(a) and 120(b). If a powered device capable of receiving four-pair inline power is plugged into, for example, port 150(1), the first multiplexer unit 120(a) delivers power along a first power distribution path (e.g., Alternative-A power) to the first power transistor device 165(a)(1) of power subsystem 160(1) and the second multiplexer unit 120(b) delivers power along a second power distribution path (e.g., Alternative-B power) to the second power transistor device 165(b)(1) of power subsystem 160(1). Thus, port 150(1) and the four-pair capable powered device plugged into port 150(1) receive Alternative-A and Alternative-B power from the first multiplexer unit 120(a) and the second multiplexer unit 120(b). Similarly, if a powered device capable of receiving four-pair inline power is plugged into port 150(n), the multiplexer units 120(a) and 120(b) deliver power to subsystem 160(n) (and ultimately port 150(n)) in a similar fashion.

Figure 5B:
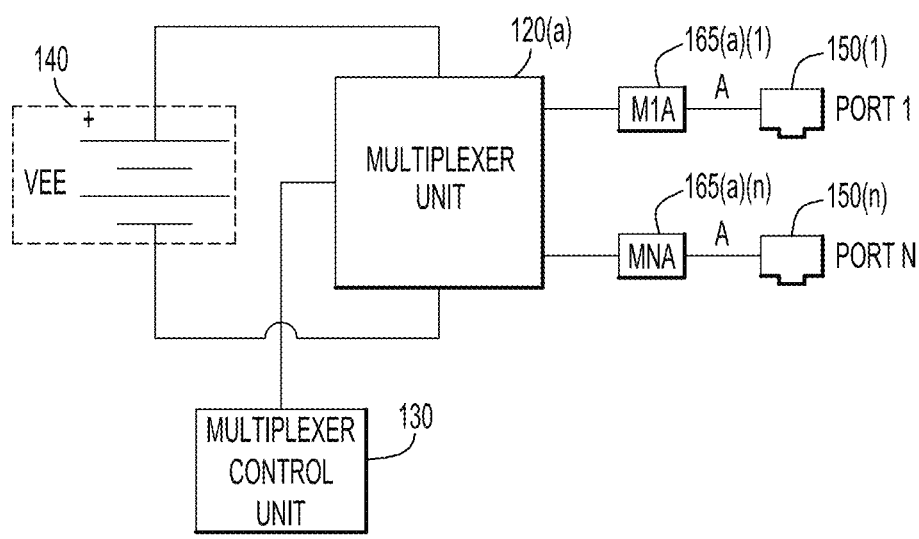
FIG. 5B shows an example system topology for delivering power to ports via a single power distribution path.

FIG. 5B shows an example system topology for delivering power to ports via a single power distribution path. For example, if a powered device is plugged into port 150(1) or 150(n) that is capable of receiving only two-pair inline power, the multiplexer control unit 130 will control multiplexer unit 120(a) to deliver power from the first power distribution path (e.g., Alternative-A power) to the corresponding ports via the first transistor device 165(a)(1) or 165(a)(n), respectively. In this example, the multiplexer control unit 130 may disable multiplexer unit 120(b) from delivering power along the second power distribution path (e.g., Alternative-B power) to the corresponding ports. Conversely, the multiplexer control unit 130 may control multiplexer unit 120(b) to deliver power from the second power distribution path (e.g., Alternative-B power) to the corresponding port via transistor 165(b)(1) or 165(b)(n) (as shown in FIG. 1), and may disable multiplexer unit 120(b) from delivering power from the first power distribution path to the corresponding port.

Thus, as depicted in FIGS. 5A and 5B, the multiplexer control unit 130 can control the first and second multiplexer units 120(a) and 120(b) to supply/deliver power from a first power distribution path (e.g., two-pair Alternative-A power), a second power distribution path (e.g., two-pair Alternative-B power) or both the first power distribution path and second power distribution path (four-pair power).

Figure 6:
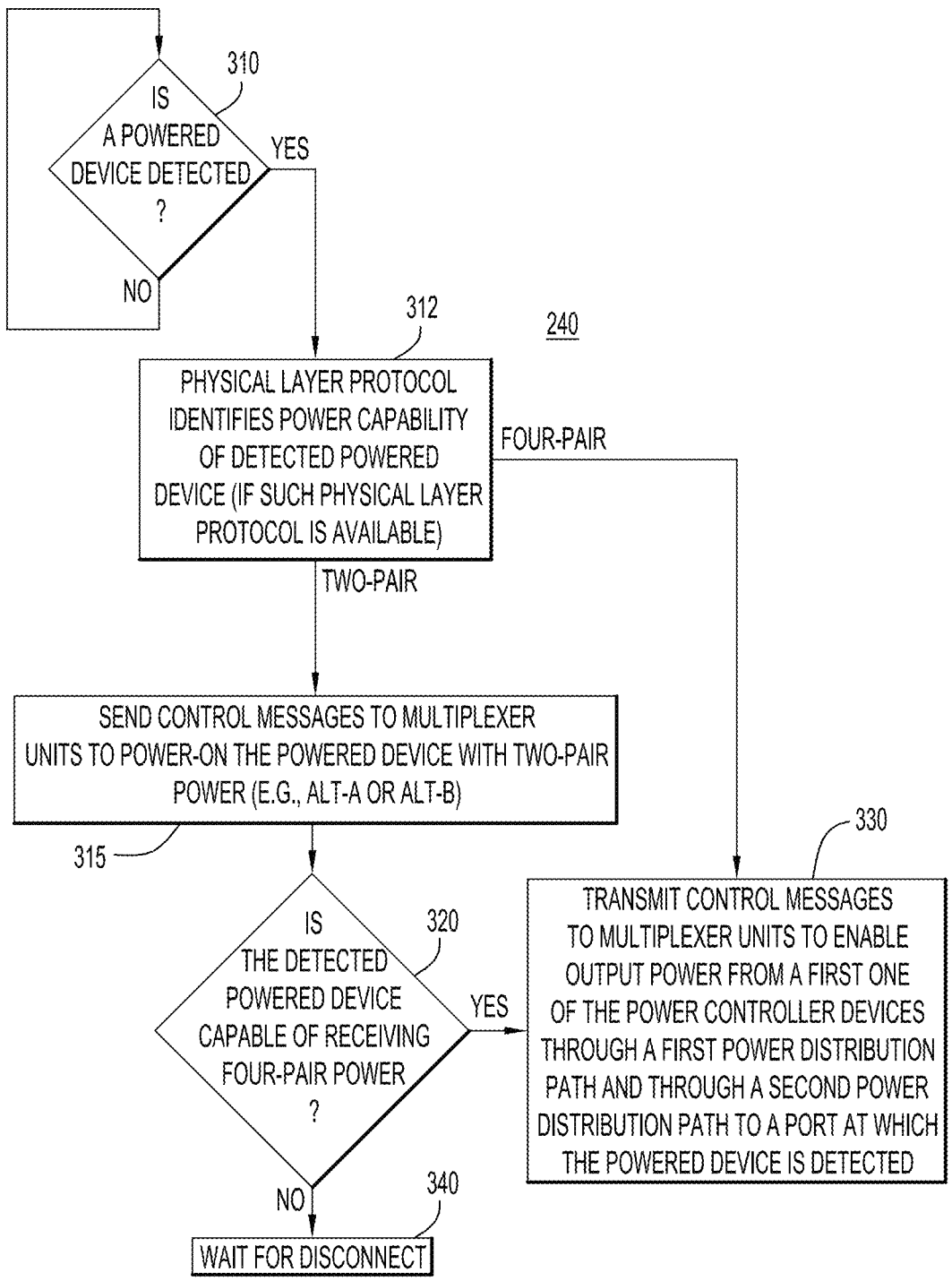
FIG. 6 shows a flow chart depicting example operations of the power device detection and multiplexer control logic of the multiplexer control unit.

Turning to FIG. 6, an example flow chart is shown that depicts operations of the power detection and multiplexer control logic 240 of the multiplexer control unit 130. At 310, it is determined whether a powered device is detected (e.g., if a powered device has been plugged into a port). If a powered device has been detected, then at 312 a physical layer protocol may be invoked to identify power capability of the detected PD. When the physical layer protocol identifies the power capability as being two-pair, processing continues at 315. When the physical layer protocol identifies the power capability as being four-pair, processing continues at 330. At 315, control messages are sent to the multiplexer units to power-on the detected powered device with 2-pair power (e.g., Alt-A or Alt-B). After the device is initially powered, at 320, it is determined whether the detected powered device is capable of receiving four-pair power in the event that the physical layer protocol referred to above at 312 is not available. If at 320 it is determined that the detected powered device is capable of receiving four-pair power, at 330, control messages are sent to the multiplexer units to enable delivery of four-pair power from a first one of the power controller devices through a first power distribution path and a second power distribution path (e.g., Alt-A and Alt-B power) to a port at which the powered device is detected.

If it is determined at 320 that the detected powered device is not capable of receiving four-pair power, then the device is continued to be powered with two-pair power and a wait state is entered at 340. If a powered device is not detected (i.e., the answer at 310 is "no"), the procedure reverts to step 310 to again determine if a powered device has been detected.

Figure 7:
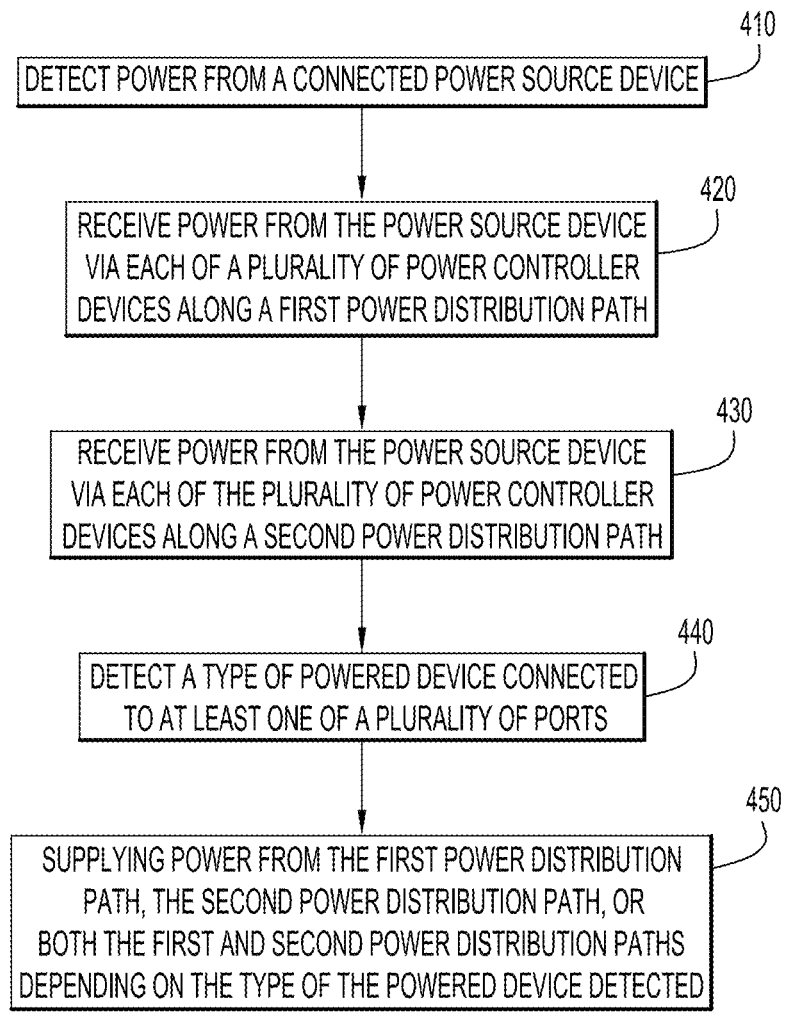
FIG. 7 shows a flow chart depicting example operations of components of the system of FIG. 1.

Reference is now made to FIG. 7 that shows a flow chart depicting an example of the overall operations of components of system 100. At 410, power is detected (e.g., at one or more of the controllers 110(1)-110(n)) from a connected power source device. At 420, power is received from the power source device via each of a plurality of power controller devices along a first power distribution path. Power is also received, at 430, from the power source device via each of the plurality of power controller devices along a second power distribution path. A type of powered device connected to at least one of the plurality of ports is detected at 440. At 450, power is supplied or delivered from the first power distribution path, the second power distribution path or from the first power distribution path and the second power distribution path to the at least one of the plurality of ports depending on the type of the powered device detected at the at least one of the plurality of ports.

The following example is provided, with reference to FIG. 1, to further explain the techniques for multiplexing the first and second power distribution channel to a plurality of ports. In a system having a 2×3 connector (6 Ethernet ports):

1. A four-pair capable powered device is plugged into port number 1 (e.g., port 150(1))
2. Under control of the multiplexer control unit 130, power from the first power controller device 110(1) (shown as power controller device C1) provides Alternative-A power to the powered device along the first power distribution path, and the sixth power controller device 110(6) (i.e., power controller device 110(n), where n=6) provides Alternative-B power to the powered device along the second power distribution path.
3. The system now has n−1=5 ports (ports 150(2) to 150(6)) that are not connected to powered devices and has n−2=4 power controller devices (e.g., power controller devices 110(2) to 110(5)) available.
4. The system multiplexes one or more power distribution paths of the power controller devices to permit IEEE 802.3 detection on all of the remaining unconnected ports. Typically, during IEEE 802.3 detecting schemes, ports are detected by only checking whether Alternative-A power is delivered to the ports. As a result, Alternative-A power is provided to the remaining, unconnected ports (e.g., ports 150(2) to 150(6)).
5. The first power distribution paths associated with power controller devices 110(2) (e.g., power controller device C2) to 110(4) (e.g., power controller device C4) may remain dedicated to ports 150(2) to 150(4), respectively, to provide Alternative-A power to these ports along the first power distribution path. The multiplexer control unit 130 instructs the first multiplexer device 120(a) to deliver Alternative-A power from power controller devices C2-C4 to ports 150(2)-150(4), respectively.
6. The multiplexer control unit 130 controls the first multiplexer device to deliver Alternative-A power from power controller device 110(5) (e.g., power controller device C5) to port 150(5).
7. The multiplexer control unit 130 performs a detection operation to determine whether a powered device is connected to port 150(5).
8. If a powered device is not connected to port 5, the first multiplexer unit 120(a) is controlled to deliver Alternative-A power from power controller device C5 to port 150(6).
9. The multiplexer control unit 130 performs a detection operation to determine whether a powered device is connected to port 150(6).
10. If a powered device is connected to port 150(6), the power controller device C5 continues delivering Alternative-A power to port 150(6).

It should be appreciated that there are many algorithms and criteria that may be used for selecting a port and the number of power controller devices to use.

It should be appreciated that the techniques described above in connection with all embodiments may be performed by one or more computer readable storage media that is encoded with software comprising computer executable instructions to perform the methods and steps described herein.

In sum, a system is provided comprising: a plurality of power controller devices configured to receive power from a power source device; a first multiplexer unit and a second multiplexer unit coupled to the plurality of power controller devices, wherein the first multiplexer unit is configured to receive power from the inline power device via each of the plurality of power controller devices for a first power distribution path and wherein the second multiplexer unit is configured to receive power from the power source via each of the plurality of power controller devices for a second power distribution path; a multiplexer control unit coupled to the first multiplexer unit and to the second multiplexer unit, and configured to control the first multiplexer unit and the second multiplexer unit so as to supply/deliver power from the first power distribution path, the second power distribution path or from both the first and second power distribution paths; a plurality of power subsystems each comprising a first power transistor unit configured to receive power from the first multiplexer unit over the first power distribution path and a second power transistor unit configured to receive power from the second multiplexer unit over the second power distribution path; and a plurality of ports each of which is configured to couple to a powered device and to supply power to the powered device from a corresponding power subsystem;

wherein the multiplexer control unit is configured to control the first and second multiplexer units to supply/deliver power to the at least one of the plurality of ports according to the type of detected powered device.

In addition, a method is provided comprising: detecting power from an power source device; receiving power from the power source device via each of a plurality of power controller devices on a first power distribution path; receiving power from the power source device via each of the plurality of power controller devices on a second power distribution path; detecting a type of powered device connected to at least one of a plurality ports; and supplying/delivering power from the first power distribution path, the second power distribution path or from both the first and second power distribution paths to the at least one of the plurality of ports depending on the type of the powered device detected at the at least one of the plurality of ports.

Furthermore, an apparatus is provided, comprising a management interface unit configured to send and receive commands over a management interface bus; and a processor coupled to the management interface unit and the memory, and configured to: detect a type of powered device connected to at least one of a plurality of ports; and control a first multiplexer unit and a second multiplexer unit so as to supply power to at least one of the plurality of ports from a first power distribution path, a second power distribution path or from both the first power distribution path and the second power distribution path based on the type of the powered device connected to the at least one of the plurality of port.

The above description is intended by way of example only. Various modifications and structural changes may be made therein without departing from the scope of the concepts described herein and within the scope and range of equivalents of the claims.

What is claimed is:

1. A system comprising:
   a plurality of power controller devices configured to receive power from a power source device;
   a first multiplexer unit and a second multiplexer unit coupled to the plurality of power controller devices, wherein the first multiplexer unit is configured to receive power from the power source device via each of the plurality of power controller devices for a first power distribution path and wherein the second multiplexer unit is configured to receive power from the power source via each of the plurality of power controller devices for a second power distribution path;
   a multiplexer control unit coupled to the first multiplexer unit and to the second multiplexer unit, and configured to control the first multiplexer unit and the second multiplexer unit so as to output power from the first power distribution path, the second power distribution path or from both the first and second power distribution paths;
   a plurality of power subsystems each comprising a first power transistor unit configured to receive power from the first multiplexer unit over the first power distribution path and a second power transistor unit configured to receive power from the second multiplexer unit over the second power distribution path; and
   a plurality of ports each of which is configured to couple to a powered device and to supply power to the powered device from a corresponding power subsystem;
   wherein the multiplexer control unit is configured to control the first and second multiplexer units to supply power to the at least one of the plurality of ports according to the type of powered device connected to the at least one of the plurality of ports.

2. The system of claim 1, wherein when a powered device capable of receiving four-pair inline power connected to a particular one of the plurality of ports is detected, the multiplexer control unit controls the first multiplexer device and the second multiplexer device so as to supply power from both the first and second distribution paths to the particular port to which the powered device is connected.

3. The system of claim 2, wherein when the powered device capable of receiving the four-pair inline power is detected, the multiplexer control unit controls the first multiplexer device to supply power from a first one of the plurality of power controller devices over the first power distribution path and controls the second multiplexer device to supply power from a second one of the plurality of power controller devices over the second power distribution path.

4. The system of claim 3, wherein when the powered device capable of receiving the four-pair inline power is detected and a powered device at one or more other ports that is capable of receiving two-pair inline power is detected, the multiplexer control unit controls the first multiplexer device and the second multiplexer device so as to supply power from the first power distribution path or the second power distribution path to the one or more other ports.

5. The system of claim 1, wherein when a powered device that uses two-pair inline power connected to one of a plurality of ports is detected, the multiplexer control unit controls the first multiplexer device and the second multiplexer device to supply power from the first power distribution path and not the second power distribution path or to output power from the second power distribution path and not the first power distribution path.

6. The system of claim 1, wherein the first multiplexer unit is configured to receive power from the inline power source via each of the plurality of power controller devices on the first power distribution path comprising Alternative-A power according to Institute of Electrical and Electronic Engineers (IEEE) 802.3 standard, and wherein the second multiplexer unit is configured to receive power from the inline power source via each of the plurality of power controller devices on the second power distribution path comprising Alternative-B power according to the IEEE 802.3 standard.

7. The system of claim 1, wherein the multiplexer control unit is configured to control the first multiplexer unit and the second multiplexer unit to output power from the first power distribution path comprising Alternative-A power according to the Institute of Electrical and Electronic Engineers (IEEE) 802.3 standard, the second power distribution path comprising Alternative-B power according to the IEEE 802.3 standard, or both the first and second power distribution paths comprising Alternative-A power and Alternative-B power according to the IEEE 802.3 standard, respectively.

8. A method comprising:
   detecting power from a power source device;
   receiving power from the power source device via each of a plurality of power controller devices on a first power distribution path;
   receiving power from the power source device via each of the plurality of power controller devices on a second power distribution path;
   detecting a type of powered device connected to at least one of a plurality ports; and
   supplying power from the first power distribution path, the second power distribution path or both the first and second power distribution paths to the at least one of the plurality of ports depending on the type of the powered device detected at the at least one of the plurality of ports.

9. The method of claim 8, wherein detecting comprises detecting a powered device capable of receiving four-pair inline power connected to a particular one of the plurality of ports and wherein supplying comprises supplying power from both the first and second power distribution paths.

10. The method of claim 9, wherein supplying power from both the first and second power distribution paths comprises supplying power from a first one of the plurality of power controller devices over the first power distribution path and supplying power from a second one of the plurality of power controller devices over the second power distribution path.

11. The method of claim 8, wherein detecting comprises detecting a powered device capable of receiving four-pair inline power connected to a particular one of the plurality of ports and detecting a powered device at one or more other ports that is capable of receiving two-pair inline power, and wherein supplying comprises supplying power from the first power distribution path or the second power distribution path to the one or more other ports.

12. The method of claim 8, wherein receiving power from the inline power device via each of the plurality of power controller devices on the first power distribution path comprises receiving Alternative-A power according to Institute of Electrical and Electronic Engineers (IEEE) 802.3 standard, and wherein receiving power from the inline power device via each of the plurality of controller devices on the second power distribution path comprises receiving Alternative-B power according to the IEEE 802.3 standard.

13. The method of claim 8, wherein supplying power comprises supplying power from the first power distribution path comprising Alternative-A power according to Institute of Electrical and Electronic Engineers (IEEE) 802.3 standard, from the second power distribution path comprising Alternative-B power according to the IEEE 802.3 standard or from both the first and second power distribution paths comprising Alternative-A and Alternative-B power, respectively, according to the IEEE 802.3 standard.

14. The method of claim 8, wherein detecting comprises detecting a powered device that uses two-pair inline power connected to the one of the plurality of ports, and wherein supplying comprises supplying power from the first power distribution path and not the second distribution path or supplying power from the second power distribution path and not the first power distribution path.

15. An apparatus comprising:
a first multiplexer unit and a second multiplexer unit coupled to a plurality of power controller devices, wherein the first multiplexer unit is configured to receive power from a power source device via each of the plurality of power controller devices for a first power distribution path and wherein the second multiplexer unit is configured to receive power from the power source via each of the plurality of power controller devices for a second power distribution path;
a management interface unit configured to send and receive commands over a management interface bus; and
a processor coupled to the management interface unit and the memory, and configured to:
control the first multiplexer unit and the second multiplexer unit so as to supply power to at least one of a plurality of ports from either the first power distribution path, from the second power distribution path, or from both the first power distribution path and second power distribution path based on a type of the powered device connected to the at least one of the plurality of ports.

16. The apparatus of claim 15, wherein the processor is further configured to control the first multiplexer unit and the second multiplexer unit so as to supply power from both the first and second power distribution paths.

17. The apparatus of claim 16, wherein the processor is further configured to control the first multiplexer unit and the second multiplexer unit so as to supply power from a first one of a plurality of power controller devices over the first power distribution path and from a second one of the plurality of power controller devices over the second power distribution path.

18. The apparatus of claim 16, wherein the processor is further configured to control the first and second multiplexer units to supply power from the first power distribution path or the second power distribution path to one or more other ports when a powered device capable of receiving two-pair inline power is detected at the one or more other ports.

19. The apparatus of claim 15, wherein the processor is further configured to control the first multiplexer unit and the second multiplexer unit so as to supply power from the first power distribution path comprising Alternative-A power according to Institute of Electrical and Electronic Engineers (IEEE) 802.3 standard, from the second power distribution path comprising Alternative-B power according to the IEEE 802.3 standard or from both the first and second power distribution paths comprising Alternative-A and Alternative-B power, respectively, according to the IEEE 802.3 standard.

20. The apparatus of claim 15, wherein the processor is further configured to control the first and second multiplexer units so as to supply power from the first power distribution path and not the second power distribution path or to supply power from the second power distribution path and not the first power distribution path when a powered device is detected that is capable of receiving two-pair inline power.

* * * * *